United States Patent [19]

Inoue et al.

[11] Patent Number: 4,761,566
[45] Date of Patent: Aug. 2, 1988

[54] INPUT CIRCUIT FOR CONVERTING CONTACT SIGNAL INTO A VOLTAGE SIGNAL

[75] Inventors: Michiya Inoue, Hino; Junichi Satoh, Hachioji, both of Japan

[73] Assignee: Fanuc Ltd, Minamitsuru, Japan

[21] Appl. No.: 12,670

[22] PCT Filed: Apr. 25, 1986

[86] PCT No.: PCT/JP86/00210
§ 371 Date: Dec. 16, 1986
§ 102(e) Date: Dec. 16, 1986

[87] PCT Pub. No.: WO86/06566
PCT Pub. Date: Nov. 6, 1986

[30] Foreign Application Priority Data

Apr. 26, 1985 [JP] Japan .................. 60-090587
Apr. 30, 1985 [JP] Japan .................. 60-092759

[51] Int. Cl.⁴ .............. H03K 19/21; H03K 19/092; H03K 5/00
[52] U.S. Cl. ..................... 307/262; 307/471; 307/475; 307/236; 307/360; 307/542.1
[58] Field of Search .............. 307/236, 262, 473, 475, 307/471, 542.1

[56] References Cited

U.S. PATENT DOCUMENTS

| | | | |
|---|---|---|---|
| 3,478,314 | 11/1969 | Wedmore | 307/471 |
| 4,068,138 | 1/1978 | Miyakawa et al. | 307/236 |
| 4,461,961 | 7/1984 | Kendall | 307/262 |
| 4,630,215 | 12/1986 | Graham | 307/236 |

*Primary Examiner*—John S. Heyman
*Attorney, Agent, or Firm*—Staas & Halsey

[57] ABSTRACT

An input circuit which converts a contact signal into a voltage signal is provided. The voltage signal output corresponding to the ON/OFF operation of the contact differs in polarity with methods of connection of the contact to a current limiting resistor at one end thereof between a power source and ground. To handle this, noncoincidence is detected between the output voltage signal level and the voltage level at the other end of the current limiting resistor connected to a voltage signal output terminal. An output signal is then generated, thereby obtaining a voltage signal output which undergoes the same polarity change corresponding to the ON and OFF states of the contact, irrespective of the method of connection of the contact used. When a large number of input circuits are used, a noncoincidence detecting circuit is provided for each of groups into which the input circuits are divided, and the voltage output signals the input circuits of each group are selectively applied to the noncoincidence detecting circuit. This permits the reduction of the scale of the entire circuit and the number of parts used.

2 Claims, 3 Drawing Sheets

4···RESISTOR
5···CONTACT

1···FILTER
2···COMPARATOR
3···CONVERTING CIRCUIT
4···RESISTOR

INPUT CIRCUIT FOR CONVERTING CONTACT SIGNAL INTO A VOLTAGE SIGNAL

BACKGROUND OF THE INVENTION

The present invention relates to a circuit for converting an interface signal from a controlled system into a voltage signal, and more particularly to an input circuit by which an interface signal provided in the form of a contact signal or a signal equivalent thereto is converted into a voltage signal.

Various types of input circuits are employed for converting an interface signal from a controlled system into a voltage signal. The simplest and cheapest way is a voltage input circuit as shown in FIG. 1.

In the voltage input circuit depicted in FIG. 1, an input signal is applied to a filter circuit 1 to remove a noise component, and is then compared with a reference voltage Vref in a comparator 2, which yields a voltage signal output when the input signal is higher than a fixed level.

On the other hand, an interface signal between a machine tool and a numerical controller or programmable controller is, in general, not a voltage signal but a contact signal or non-contact signal equivalent thereto which is produced by a semiconductor element is, a signal resulting from an ON/OFF operation. Accordingly, in order to read out such a contact signal and derive therefrom a voltage signal output, an input circuit is needed which is provided with a circuit for converting the contact signal into a voltage signal.

With such an input circuit, when the interface signal is the above-mentioned contact signal, it is necessary to produce a voltage signal whose polarity always changes in the same a manner in response to the turning ON and OFF of the contact, irrespective of the arrangement of the contact signal generating circuit. Further, it is demanded that the input circuit be as simple in structure as possible even if many contact signal generating circuits are employed.

Heretofore, such an input circuit as depicted in FIG. 2 has been used for converting the above-said contact signal into a voltage signal output. In FIGS. 2A and 2B, reference numeral 3 indicates generally a converting circuit, 4 a resistor, 5 a contact, ① a power source terminal, ③ a signal terminal, ② a terminal connected to one end of the resistor 4 connected at the other end to the signal terminal 3, and ④ a grounding terminal. The signal terminal ③ is connected to the input side of the input circuit shown in FIG. 1.

There are two kinds of methods for connecting the contact to the converting circuit shown in FIGS. 2A and 2B; one is to ground the contact at one end thereof and the other is to connect the contact at one end to the power source. FIG. 2A shows the connection of one end of the contact to the grounding terminal, in which case the terminals and are short-circuited and the contact 5 is connected between the terminals and . FIG. 2B shows the connection of the contact 5 to the power source terminal ①, in which case the contact 5 is connected between the terminals ① and ③ and the terminals ② and ④ are short-circuited. Usually, these two kinds of connections are selectively employed in accordance with the safety standards adopted and the contact connecting position on the side of the machine tool.

With the input circuit shown in FIGS. 2A and 2B, the polarity of the voltage signal output resulting from the turning ON or OFF of the contact 5 differs with the methods of conenction depicted in FIGS. 2A and 2B.

Accordingly, the convetional input circuit presents the problem that the sign of the input signal, which is applied to an internal control logic of the numerical controller or programmable controller in response to the ON/OFF operation of the contact, differs depending upon which of the abovementioned methods of connection is employed.

SUMMARY OF THE INVENTION

To solve the above problem, the input circuit of the present invention basically has such a arrangement as shown in FIG. 3. Reference numeral 101 indicates the same input circuit as depicted in FIGS. 2A and 2B, which circuit responds to the turning ON and OFF of the contact 5 to yield voltage signal outputs whose polarities differ with the methods of connection of FIGS. 2A and 2B indicated by the solid and broken lines. Reference numeral 102 designates voltage level detecting means, which detects the voltage level at the terminal in the input circuit 101 and produces an output signal. Reference numeral 103 identifies noncoincidence detecting means, which detects noncoincidence between the output signal of the input circuit 101 and the ouput signal of the voltage level detecting means 102 and yeilds a voltage signal output.

According to the interface circuit of the present invention, even if the polarities of the voltage signal outputs from the input circuit 101 responsive to the turning ON and OFF of the contact are reversed (dependent upon the method of connection of the contact in the converting circuit) the output signals of the input circuit 101 are each inverted by the noncoincidence detecting means 103. The output signals of the input circuit 101 can also be held noninverted in accordance with the output signal corresponding to the voltage level at the other end of the resistor detected by the voltage level detecting means 102. Therefore, the voltage signal output which undergoes the same polarity change can be obtained in response to the ON/OFF operation of the contact, irrespective of the method of connection in the converting circuit.

DESCRIPTION OF THE PREFERRED EMBODIMENTS

Figure 1:
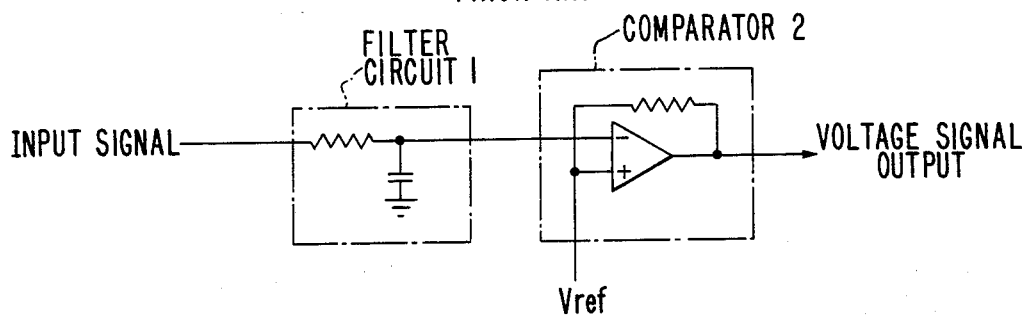
FIG. 1 is a diagram illustrating a voltage input circuit.
Figure 2A:
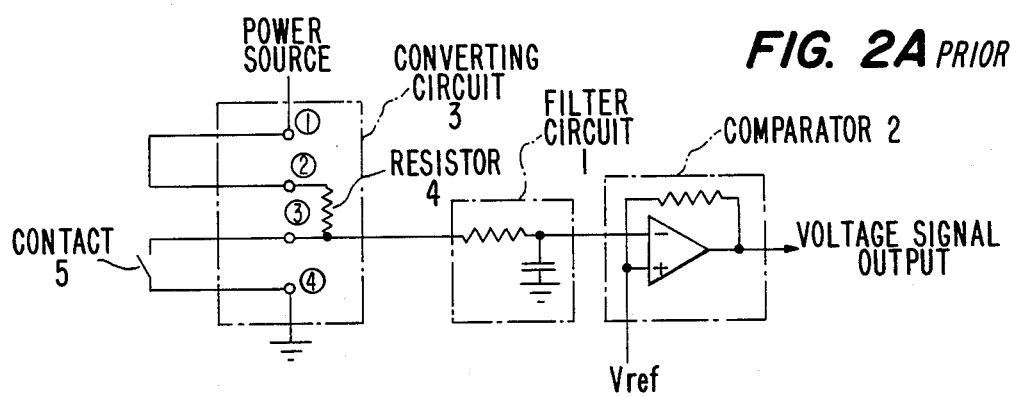
FIGS. 2A and 2B are shows convertional input circuits.
Figure 2B:
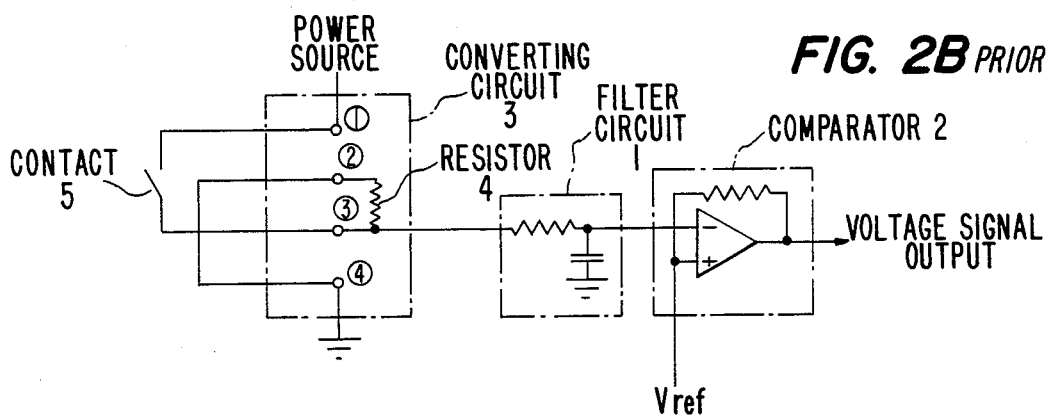
Figure 3:
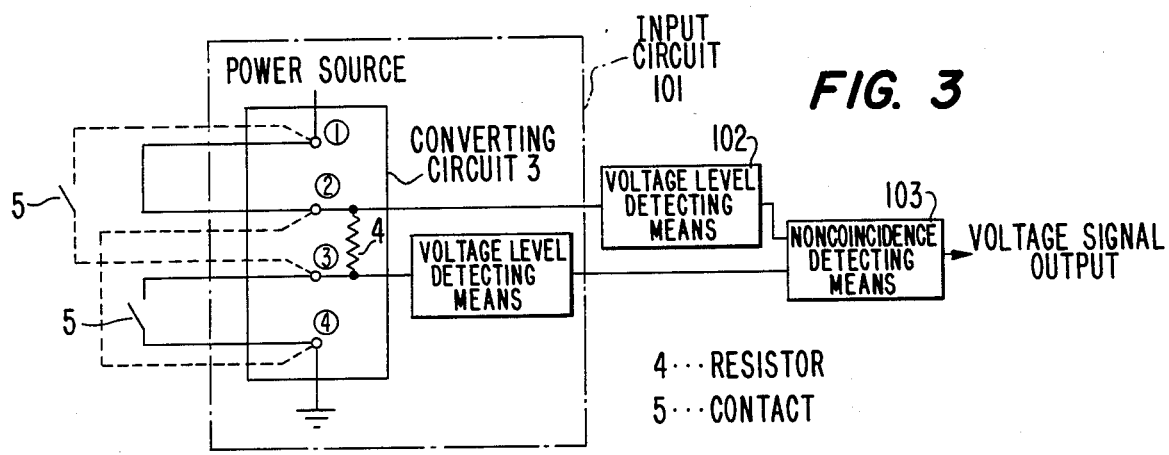
FIG. 3 is a diagram illustrating the basic constitution of the present invention.
Figure 4A:
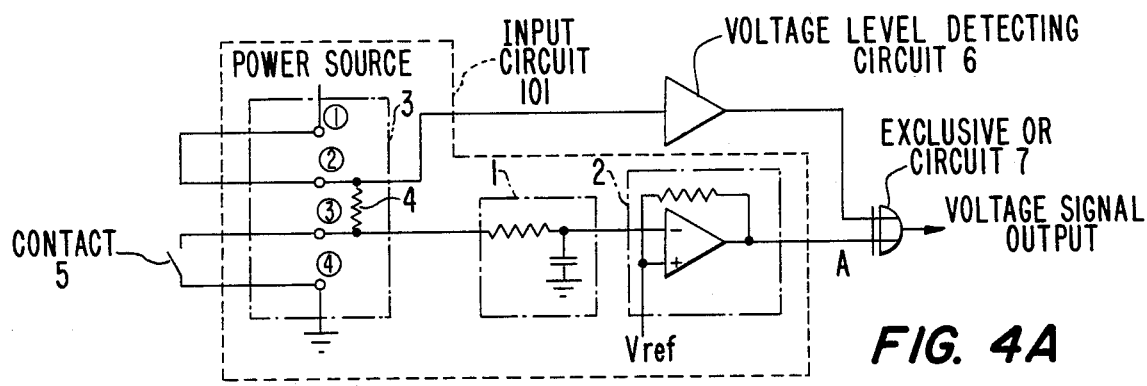
FIGS. 4A and 4B are diagrams illustrating the arrangement of an embodiment of the present invention.
Figure 4B:
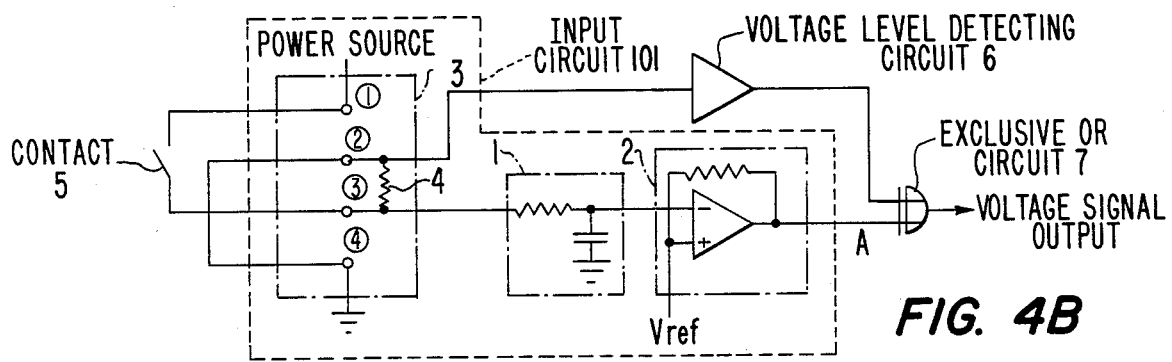

FIGS. 4A and 4B illustrate the arrangement of an embodiment of the input circuit of the present invention. FIG. 4A showing the case where the contact 5 is connected to grounding side of the converting circuit 3, and FIG. 4B the case where the contact 5 is connected to the power source side of the converting circuit 3. In FIGS. 4A and 4B the part corresponding to those in FIGS. 2A and 2B are identified by the same reference numerals. Reference numeral 6 designates a voltage level detecting circuit and 7 an exclusive OR circuit.

The contact 5 can be a mechanical switch, relay, or semiconductor switch, i.e., an element which performs switching between an open circuit and a short circuit, or between a high impedance and low impedance, in an electrical path, as shown in FIGS. 4A and 4B.

In FIG. 4A, a low-level or high-level output is provided at the terminal ③ depending upon whether the contact 5 has been turned ON or OFF, and the output level of the comparator ② goes high or low correspondingly. On the other hand, the output of the voltage level detecting circuit 6 remains high-level at all times. The exclusive OR circuit 7 detects noncoincidence between the output of the comparator ② and the output of the voltage level detecting circuit 6, and generates a low-level or high-level output depending upon whether the contact 5 is in the ON or OFF state. That is, the output level of the exclusive OR circuit is an inverted version of the voltage output level of the input circuit 101.

In FIG. 4B, a high-level or low-level output is provided at the terminal ③ depending upon whether the contact 5 has been turned ON or OFF, and the output level of the comparator 2 goes low or high accordingly. The output of the voltage level detecting circuit is always low-level. The exclusive OR circuit 7 detects noncoincidence between the output of the comparator 2 and the output of the voltage level detecting circuit 6, and yields a low-level or high-level output depending upon whether the contact 5 is in the ON or OFF state. Namely, the output level of the exclusive OR circuit is a noninverted version of the voltage output level of the input circuit 101.

The input circuit depicted in FIGS. 4A and 4B necessitates the voltage level detecting circuit and the exclusive OR circuit for each interface signal. Accordingly, when the number of interface signals used is large, the input circuit inevitably becomes enlarged in scale, which goes against a demand for smaller and more economical circuit structures.

Figure 5:
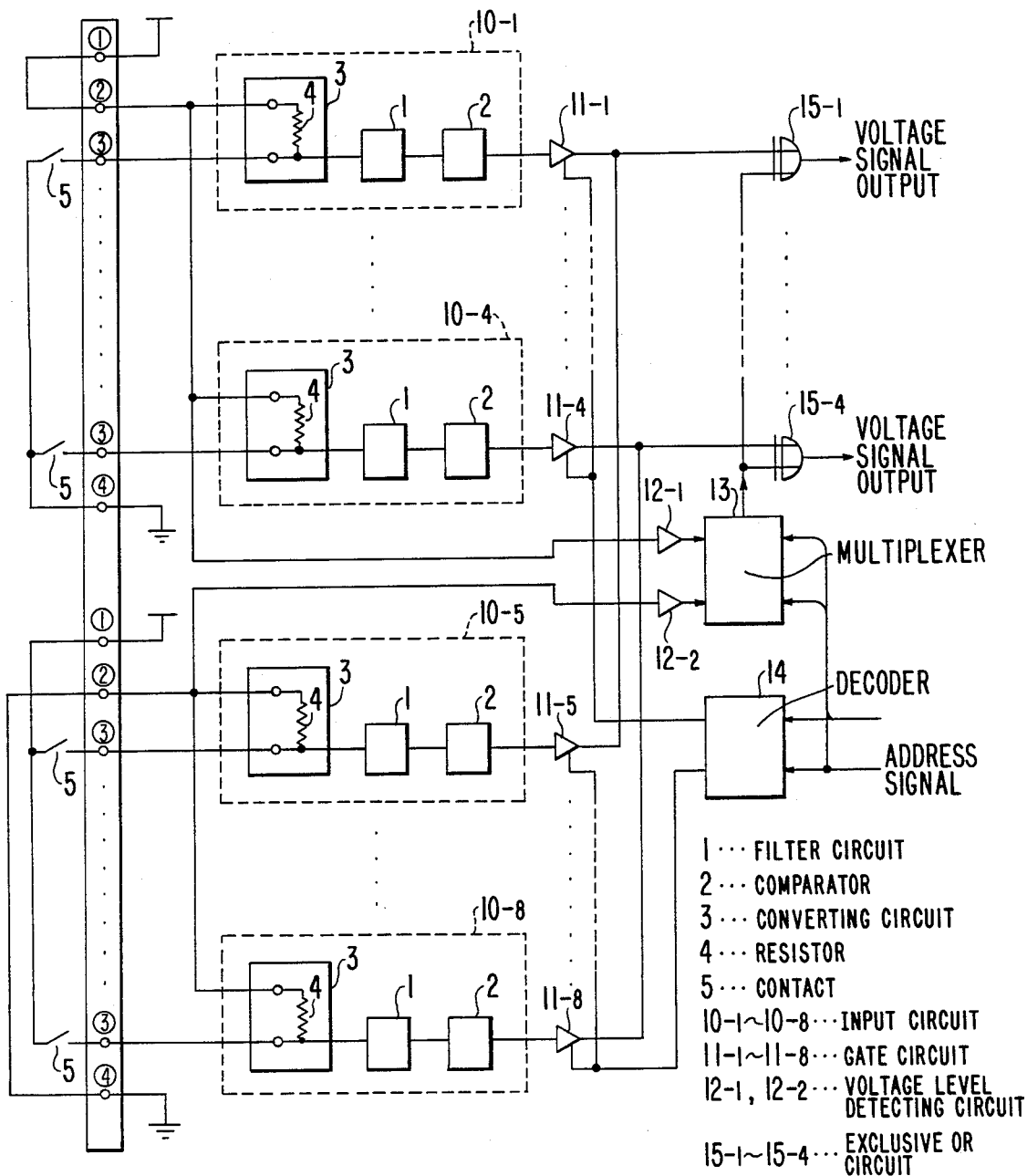
FIG. 5 is a diagram showing the arrangement of another embodiment of the present invention.

FIG. 5 illustrates the arrangement of another embodiment of the present invention which is designed to overcome such a defect. Reference numerals 10-1 to 10-4 and 10-5 to 10-8 indicate input circuits which are identical in construction with the input circuit 101 shown in FIGS. 4A and 4B, and quartets of such input circuits constitute input circuit groups, respectively. In the circuits 10-1 to 10-4, the grounding terminal ④ is common to them, the contact 5 is connected between the terminals and , and the terminals and are short-circuited. In the input circuits 10-4 to 10-8, in which the power source terminal 1 is common, the contact 5 is connected between the terminals ③ and ④ and the terminals ① and ② are short-circuited. The outputs of the input circuits 10-1 to 10-4 and 10-5 to 10-8 are respectively connected to gate circuits 11-1 to 11-4 and 11-5 to 11-8. There terminals of the input circuits 10-1 to 10-4 and 10-5 to 10-8 are connected to voltage level detecting circuits 12-1 and 12-2, respectively. The voltage level detecting circuits 12-1 and 12-2 are, in turn, connected to a multiplexer 13 for selectively outputting signals from the voltage level detecting circuits 12-1 and 12-2. The corresponding outputs of the input circuits 10-1 to 10-4 and 10-5 and 10-8 are respectively connected in parallel and are connected to exclusive OR circuits 15-1 and 15-4 at one input thereof. The output selected by the multiplexer 13 is applied to the other inputs of the exclusive OR circuits which are common to them.

Now, in the case of obtaining from one of the input circuit groups, for example, the input circuits 10-1 to 10-4, voltage signal outputs converted from contact signals, the output of the voltage level detecting circuit 12-1 is selected by the multiplexer 13 in accordance with an address signal, and the gate circuits 11-1 to 11-4 are enabled by the same address signal via a decoder 14. As a result of this operation, the exclusive OR circuits 15-1 to 15-4 are supplied with the voltage outputs of the input circuits 10-1 to 10-4 and the output of the voltage level detecting circuit 12-1. In this instance, since the input circuits 10-1 to 10-4 each creates a high-level or low-level output depending upon whether the contact 5 is in the ON or OFF state and the voltage level detecting circuit 12-1 always yields a high-level output, as referred to previously with respect of FIG. 4A, the exclusive OR circuits 15-1 to 15-4 each detects noncoincidence between the both inputs. The exclusive OR circuits 15-1 to 15-4 also generate a low-level or high-level voltage signal output in dependence upon whether the contact 5 is in the ON or OFF state.

In the case of obtaining from the other group of input circuits (10-5 to 10-8) voltage signal outputs converted from contact signals, the output of the voltage level detecting circuit 12-2 is selected by the address signal in the multiplexer 13 and the gate circuits 11-5 to 11-8 are turned ON via the decoder 14 in the same manner as described above.

Consequently, the exclusive OR circuits 15-1 to 15-4 are supplied with the voltage outputs from the input circuits 10-5 to 10-8 and the output from the voltage level detecting circuit 12-2. Since the input circuits 10-5 to 10-8 each yield a low-level or high-level output depending on whether the contact 5 is in the ON or OFF state and the voltage level detecting circuit 12-2 always creates a low-level output, as described previously with regard to FIG. 4B, the exclusive OR circuits 15-1 to 15-4 each generate a low-level or high-level voltage signal output in dependence upon whether the contact 5 is in the ON and OFF state.

As described above, according to the input circuit system of this embodiment, the output from the input circuit, which differs in polarity according to the connection of the contact to the converting circuit, is inverted by a noncoincidence circuit or held. Thus, it is possible to obtain a voltage output signal which undergoes the same polarity change in response to the ON/OFF operation of the contact.

While this embodiment has been described in connection with employing two input circuit groups each composed of four input circuits, the input circuit system of the present invention is more effective when more input signals are employed. For instance, when the number of input signals is 64, the voltage level detecting circuits (12-1) can be reduced to $\frac{1}{8}$ by using eight input circuit groups each composed of eight input circuits.

We claim:

1. An interface circuit including a resistor connected at one end to a power source or ground, a switching means connected between the other end of the resistor and ground or the power source, depending on whether the resistor is connected at one end to the power source or ground, and first voltage detecting means for detecting a voltage level at a connection point between the switching means and the resistor and outputting a logic output signal corresponding to the voltage level at the connection point, said interface circuit comprising:

second voltage level detecting means for detecting a voltage level at the connection point between the resistor and the power source or ground and outputting an output logic signal indicating whether the power source or ground is connected to the connection point; and means for detecting noncoincidence between the output signal of said second voltage level detecting means and the output signal of the first voltage level detecting means and generating a voltage signal output, accordingly.

2. An input circuit system including a plurality of input circuits, each having first and second terminals interconnected via a resistor, a voltage level detecting circuit for detecting the voltage level at the second terminal, a third terminal connected to a power source, and a fourth terminal connected to ground, the input circuits being divided into a plurality of groups, the first terminals of the input circuits being connected together, said input circuit system comprising:

a plurality of gate circuits, connected to said input circuits and the voltage level detecting circuits, for turning ON and OFF the outputs of the voltage level detecting circuits;

voltage level detecting means, connected to the input circuits, for detecting the voltage levels at each of the first terminals of respective groups of the input circuits and outputting an output signal;

a multiplexer, connected to receive the output signal form said voltage level detecting means, for selecting the output signal from said voltage level detecting means coinciding to one of the groups of input circuits in which noncoincidence is desired and outputting a selected signal; and a plurality of noncoincidence detecting means, having one input connected to receive the selected signal from said multiplexer and having another input connected to a parallel connection of outputs of said gate circuits of respective groups of input circuits, for detecting noncoincidence between the signals on the inputs and generating an output signal corresponding thereto.

* * * * *

UNITED STATES PATENT AND TRADEMARK OFFICE
CERTIFICATE OF CORRECTION

PATENT NO. : 4,761,566

DATED : AUGUST 2, 1988

INVENTOR(S) : MICHIYA INOUE ET AL.

It is certified that error appears in the above-identified patent and that said Letters Patent is hereby corrected as shown below:

Title page:

FRONT PAGE [57] ABSTRACT, line 18, "signals the" should be --signals from the--.

Col. 1, line 27, "element is," should be --element. That is,--;
  line 36, delete "a";
  line 57, "terminal , in" should be --terminal ④, in--;
  line 58, "terminals and " should be --terminals ① and ②--;
  line 59, "terminals and ." should be --terminals ③ and ④.--.

Col. 2, line 2, "conenction" should be --connection--;
  line 3, "convetional" should be --conventional--;
  line 22, "terminal in" should be --terminal ② in--;
  line 27, "yeilds" should be --yields--;
  line 47, delete "shows".

Col. 3, line 1, start a new paragraph, with paragraph indentation, beginning with "The contact 5";
  line 46, "terminal④is" should be --terminal ④ is--;
  line 48, " and, and the terminals and are" should be --③ and ④, and the terminals ① and ② are--;

UNITED STATES PATENT AND TRADEMARK OFFICE
CERTIFICATE OF CORRECTION

PATENT NO. : 4,761,566

DATED : AUGUST 2, 1988

INVENTOR(S) : MICHIYA INOUE ET AL.

It is certified that error appears in the above-identified patent and that said Letters Patent is hereby corrected as shown below:

Col. 3, line 51, "③ and ④" should be --① and ③,--; and "terminals ①" should be --terminals ②--;

line 52, "and ②" should be --and ④--;

line 55, "There terminals of" should be --The terminals ② of--.

Col. 6, line 8, "form" should be --from--.

Signed and Sealed this

Twenty-ninth Day of November, 1988

Attest:

DONALD J. QUIGG

Attesting Officer  Commissioner of Patents and Trademarks